(12) United States Patent
Kim et al.

(10) Patent No.: US 8,786,064 B2
(45) Date of Patent: Jul. 22, 2014

(54) SEMICONDUCTOR PACKAGE AND METHOD FOR MANUFACTURING THE SAME AND SEMICONDUCTOR PACKAGE MODULE HAVING THE SAME

(75) Inventors: Jin Su Kim, Seoul (KR); Ji Man Ryu, Gyunggi-do (KR); Soon Gyu Yim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/361,144

(22) Filed: Jan. 30, 2012

(65) Prior Publication Data

US 2013/0105955 A1    May 2, 2013

(30) Foreign Application Priority Data

Oct. 27, 2011  (KR) .................. 10-2011-0110490

(51) Int. Cl.
*H01L 23/495* (2006.01)
*H01L 21/50* (2006.01)
*H01L 23/48* (2006.01)

(52) U.S. Cl.
USPC ..................... 257/676; 257/668; 257/685

(58) Field of Classification Search
USPC ............... 257/666–689, E23.031, E23.052
See application file for complete search history.

(56) References Cited

U.S. PATENT DOCUMENTS

| 6,486,545 | B1 | 11/2002 | Glenn et al. | |
|---|---|---|---|---|
| 6,943,433 | B2 * | 9/2005 | Kamada | 257/666 |
| 7,436,048 | B2 * | 10/2008 | Ha et al. | 257/666 |
| 2005/0194676 | A1 * | 9/2005 | Fukuda et al. | 257/698 |

FOREIGN PATENT DOCUMENTS

| JP | 09-129822 | 5/1997 |
|---|---|---|
| JP | 2008-124176 | 5/2008 |
| KR | 10-2001-0111736 | 12/2001 |
| KR | 10-2006-0121671 | 11/2006 |
| KR | 10-2009-0021752 | 3/2009 |

OTHER PUBLICATIONS

Office Action issued for related Korean Patent Application No. 10-2011-0110490, dated Feb. 26, 2013, and its English summary provided by clients.

* cited by examiner

*Primary Examiner* — Cuong Q Nguyen
(74) *Attorney, Agent, or Firm* — Ladas & Parry, LLP

(57) ABSTRACT

Disclosed herein is a semiconductor chip, including: a first substrate having a concave formed on one surface thereof and an opening formed on a bottom surface of the concave; a second substrate contacting the other surface of the first substrate; and a semiconductor chip mounted in the concave.

20 Claims, 3 Drawing Sheets

SEMICONDUCTOR PACKAGE AND METHOD FOR MANUFACTURING THE SAME AND SEMICONDUCTOR PACKAGE MODULE HAVING THE SAME

CROSS REFERENCE TO RELATED APPLICATION

This application claims the benefit of Korean Patent Application No. 10-2011-0110490, filed on Oct. 27, 2011, entitled "Semiconductor Package and Method for Manufacturing the Same and Semiconductor Package Module Having the Same", which is hereby incorporated by reference in its entirety into this application.

BACKGROUND OF THE INVENTION

1. Technical Field

The present invention relates to a semiconductor package and a method for manufacturing the same and a semiconductor package module having the same.

2. Description of the Related Art

The trend for electronics has developed toward miniaturization and thinness regardless of an application field. The main focus has still been that the size decreases, while reliability should be maintained as it is or improved.

For example, in the case of products that deal with electric power, a factor for the reliability degradation, which is called heat generation is added and reliability should be considered more deeply than all other application fields.

In particular, when a plurality of power semiconductors are grouped to implement one module, issues such as thermal accumulation, property degradation by heat, and life-span reduction may serve as risk factors causing the concepts and structures of products to be changed in a second.

Meanwhile, examples of forgiving the reduction of a manufacturing cost have rapidly increased for the purpose of improving the reliability of the product.

The power semiconductor module in the related art is disclosed in Korean Patent No. 2001-0111736 (Korean unexamined publication).

The power semiconductor module in the related art uses a first substrate with a circuit and a second substrate performing a heat dissipating function, which are bonded to each other.

In this case, an adhesive containing an epoxy-based resin or solder is used in order to bond the first substrate and the second substrate and the first substrate and a semiconductor chip are bonded by using the same material as the adhesive or another adhesive.

However, the above method is disadvantageous in that a plurality of substrates are bonded or the substrate and the semiconductor chip are bonded by using the adhesive of the same material or adhesives of different materials, and as a result, heterogeneous materials are formed among the components, thereby reducing thermal and mechanical reliabilities among the components.

Further, since a method using two processes, i.e., bonding the first substrate and the second substrate and bonding the semiconductor chip onto the first substrate of bonding is used, processes as many as the components should be performed. Therefore, a process time increases and thus, efficiency decreases and as the number of processes increases, the quantity of used materials also increases, thereby causing a manufacturing cost to increase.

SUMMARY OF THE INVENTION

The present invention has been made in an effort to provide a semiconductor package and a method for manufacturing the same and a semiconductor package module having the same that can simplify a process, reduce a manufacturing cost, and improve heat-proof reliability.

According to a preferred embodiment of the present invention, there is provided a semiconductor chip, including: a first substrate having a concave formed on one surface thereof and an opening formed on a bottom surface of the concave; a second substrate contacting the other surface of the first substrate; and a semiconductor chip mounted in the concave.

In this case, the semiconductor package may further include a bonding section interposed between the first substrate and the second substrate.

Herein, the bonding section may contact the semiconductor chip mounted in the concave through the opening of the first substrate and the bonding section may be made of solder, a non-conductive epoxy-based resin, a conductive resin, or a conductive film.

Further, the first substrate and the second substrate may be a metallic substrate, a ceramic substrate, or an epoxy based resin substrate.

According to another preferred embodiment of the present invention, there is provided a method for manufacturing a semiconductor package, including: preparing a first substrate having a concave formed on one surface thereof and an opening formed on a bottom surface of the concave and a second substrate having a plate shape; forming an adhesive layer on one surface of the second substrate; bonding the other surface of the first substrate to one surface of the second substrate with the adhesive layer; mounting a semiconductor chip in the concave of the first substrate; and bonding the semiconductor chip, and the first substrate and the second substrate by performing a hardening process.

The adhesive layer may be made of solder, a non-conductive epoxy-based resin, a conductive resin, or a conductive film and the first substrate and the second substrate may be a metallic substrate, a ceramic substrate, or an epoxy based resin substrate.

According to yet another preferred embodiment of the present invention, there is provided a semiconductor package module, including: a first substrate having one or more concaves formed on one surface of one side thereof and an opening formed on a bottom surface of the concave; a second substrate having one surface of one side thereof contacting the other surface of one side of the first substrate; and a first semiconductor chip mounted in the concave, and the other side of the first substrate may protrude from the second substrate to the outside.

In this case, the semiconductor package module may further include a bonding section interposed between the other surface of one side of the first substrate and one surface of one side of the second substrate.

Herein, the bonding section may contact the semiconductor chip mounted in the concave through the opening of the first substrate.

The bonding section may be made of solder, a non-conductive epoxy-based resin, a conductive resin, or a conductive film.

The first substrate may be a lead frame made of copper (Cu).

The semiconductor package module may further include: a third substrate contacting the other side of one surface of the second substrate; and a second semiconductor chip mounted on the third substrate.

The semiconductor package module may further include the lead frame electrically connected with the third substrate.

Herein, the third substrate may be a printed circuit board (PCB).

The semiconductor package module may further include a connection member electrically connecting the first semiconductor chips mounted in the one or more concaves to each other.

Herein, the connection member may be a tape type, a frame type, or a ribbon type.

The semiconductor package module may further include a molding material formed to surround a top surface of the first semiconductor chip from a side surface of the second substrate and a part of an area of the molding material corresponding to the first semiconductor chip may be removed in a thickness direction from the surface thereof.

DESCRIPTION OF THE PREFERRED EMBODIMENTS

Figure 1:
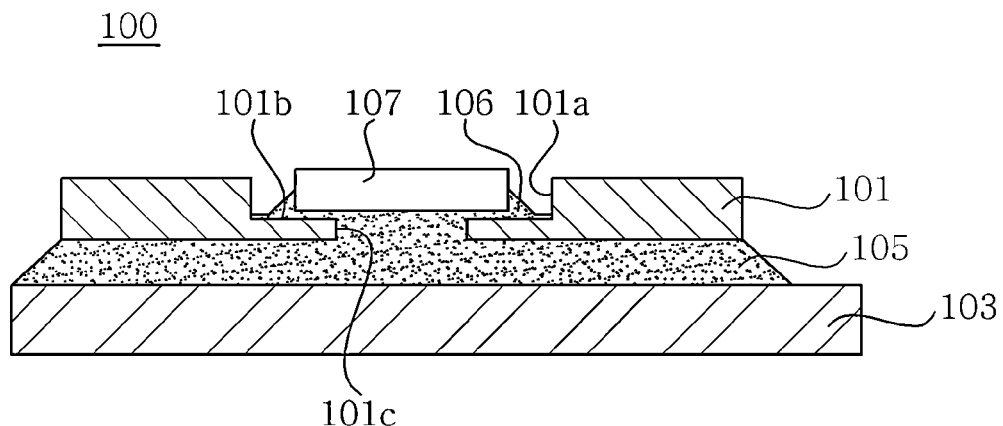
FIG. 1 is a cross-sectional view illustrating the structure of a semiconductor package according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. In describing the present invention, a detailed description of related known functions or configurations will be omitted so as not to obscure the gist of the present invention. In the description, the terms "first", "second", "one surface", "the other surface" and so on are used to distinguish one element from another element, and the elements are not defined by the above terms.

Hereinafter, preferred embodiments of the present invention will be described in detail with reference to the accompanying drawings.

Semiconductor Package

FIG. 1 is a cross-sectional view illustrating the structure of a semiconductor package according to a preferred embodiment of the present invention.

Referring to FIG. 1, a semiconductor package 100 according to the preferred embodiment includes a first substrate 101 having a concave 101a formed on one surface thereof, a second substrate 103 positioned on the other surface of the first substrate 101, and a semiconductor chip 107 mounted in the concave.

In the first substrate 101, the concave 101a may be formed on one surface thereof and an opening 101c may be formed on a bottom surface 101b of the formed concave 101a as shown in FIG. 1.

In the preferred embodiment, a metallic substrate, a ceramic substrate, and a substrate made of an epoxy resin may be used as the first substrate 101, but is not particularly limited thereto and even any material to form a circuit pattern may be used.

Herein, the metallic substrate may be made of copper (Cu), but is not particularly limited thereto.

The second substrate 103 may be positioned to contact the other surface of the first substrate 101, i.e., an opposite surface to a surface of the first substrate 101 where the concave 101a is formed, as shown in FIG. 1.

Herein, the metallic substrate, the ceramic substrate, and the substrate made of the epoxy resin may be used as the second substrate 103, but is not particularly limited thereto. In this case, the metallic substrate may be made of copper (Cu), but is not particularly limited thereto.

Further, in the preferred embodiment, the second substrate 103 may have a plate shape, but is not particularly limited thereto.

In the preferred embodiment, the semiconductor chip 107 may be mounted in the concave 101a of the first substrate 101. Specifically, the semiconductor chip 107 may be mounted to contact the opening 101c formed on the bottom surface 101b of the concave 101a of the first substrate 101.

In the preferred embodiment, the semiconductor chip 107 may include a power element and a control element for controlling the power element, but is not particularly limited thereto.

Herein, the power element may include a silicon controlled rectifier (SCR), a power transistor, an insulated gate bipolar transistor (IGBT), a MOS transistor, a power rectifier, a power regulator, an inverter, a converter, or a high-power semiconductor chip or diode constituted by combinations thereof, but is not particularly limited thereto.

Further, the control element may include a low-power semiconductor chip for controlling the power element.

In addition, the semiconductor package 100 according to the preferred embodiment may further include a bonding section 105 interposed between the first substrate 101 and the second substrate 103.

Herein, the bonding section 105 may be made of solder, a non-conductive epoxy based resin, a conductive resin, or a conductive film, but is not particularly limited thereto.

In the preferred embodiment, the bonding section 105 may be joined with the semiconductor chip 107 of which a part 106 is inserted into the concave 101a of the first substrate 101 through the opening 101c of the first substrate 101, as shown in FIG. 1.

That is, the part 106 of the bonding section 105 interposed between the first substrate 101 and the second substrate 103 is inserted into the concave 101a of the first substrate 101 through the opening 101c of the first substrate 101 to contact the semiconductor chip 107.

As described above, since the semiconductor package 100 according to the preferred embodiment has a structure in which all the components of the semiconductor package 100, i.e., the first substrate, 101, the second substrate 103, and the semiconductor chip 107 are integratively connected by one bonding section 105 or 106), the semiconductor package 100 may improve reliability of a product.

Method for Manufacturing Semiconductor Package

Figure 2:
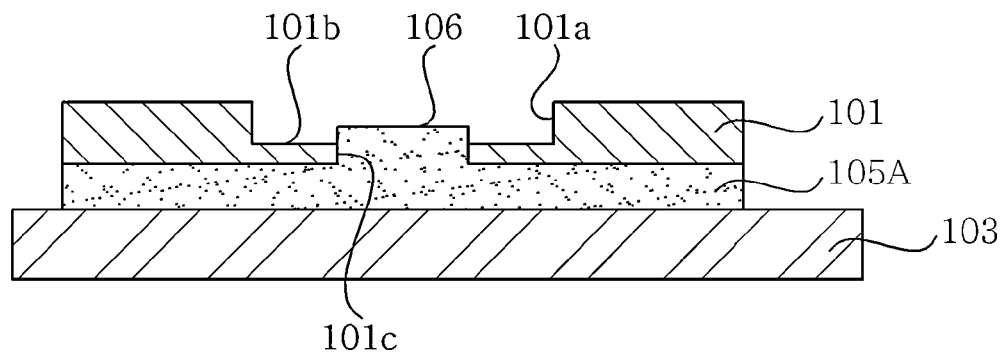
FIGS. 2 to 4 are cross-sectional views sequentially illustrating the process of manufacturing a semiconductor package according to a preferred embodiment of the present invention.
Figure 3:
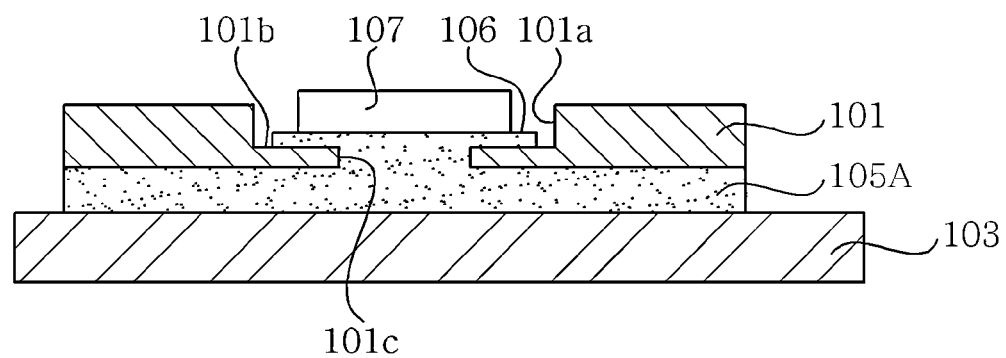
Figure 4:
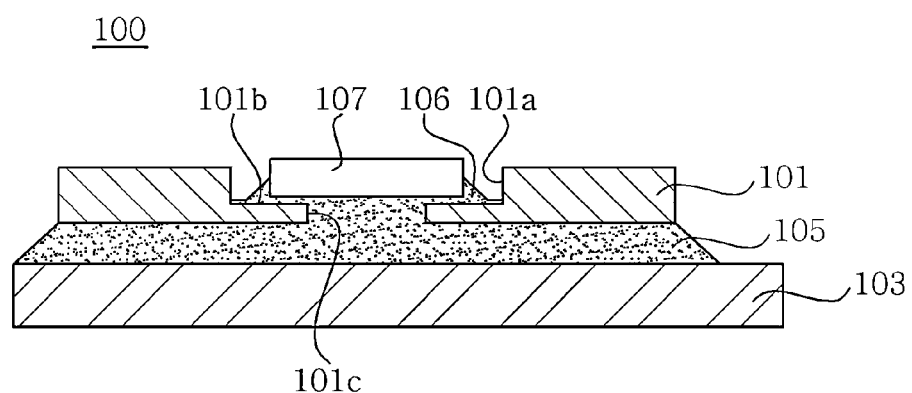

FIGS. 2 to 4 are cross-sectional views sequentially illustrating the process of manufacturing a semiconductor package according to a preferred embodiment of the present invention.

Referring to FIG. 2, a first substrate 101 and a second substrate 103 are prepared, an adhesive layer 105A is formed on one surface of the second substrate 103, and thereafter, the other surface of the first substrate 101 is bonded to one surface of the second substrate 103.

In the preferred embodiment, in the first substrate 101, a concave 101a may be formed on one surface thereof and an opening 101c may be formed on a bottom surface 101b of the formed concave 101a as shown in FIG. 2.

Further, the second substrate 103 may have a plate shape, but is not particularly limited thereto.

Herein, a metallic substrate, a ceramic substrate, and an epoxy based resin substrate may be used as the second substrate 103, but is not particularly limited thereto. In this case, copper (Cu) may be used as metal, but is not particularly limited thereto.

In the preferred embodiment, the adhesive layer 105A formed on one surface of the second substrate 103 may be made of solder, a non-conductive epoxy based resin, a conductive resin, or a conductive film, but is not particularly limited thereto.

The first substrate 101 is positioned on one surface of the second substrate 103 with the other surface of the first substrate 101 contacting one surface of the second substrate where the adhesive layer 105A is formed and thereafter, the first substrate 101 is pre-bonded to the second substrate, 103 by applying predetermined pressure to one surface of the first substrate 101.

In this case, by applying the predetermined pressure, the part 106 of the adhesive layer 105A may be inserted into the concave 101a through the opening 101c of the first substrate 101.

Next, referring to FIG. 3, the semiconductor chip 107 may be mounted in the concave 101a of the first substrate 101.

Herein, the semiconductor chip 107 may be mounted on a partial adhesive layer 106 that is inserted into the concave 101a through the opening 101c of the first substrate 101. In this case, referring to FIG. 3, predetermined pressure is applied to the top surface of the semiconductor chip 107, which is pressed to the adhesive layer 106 to pre-bond the semiconductor chip 107 and the first substrate 101.

As described above, the semiconductor chip 107 is pressed to the partial adhesive layer 106 inserted into the concave 101a, and as a result, the partial adhesive layer 106 inserted into the concave 101a is dispersed to the side as shown in FIG. 3.

Next, as shown in FIG. 4, the semiconductor chip 107, and the first substrate 101 and the second substrate 103 are bonded to each other by performing a hardening process.

In the prior art, two bonding processes of bonding the first substrate 101 and the second substrate 103 to each other and thereafter, bonding the semiconductor chip 107 onto the first substrate 101 are performed, but in the preferred embodiment, the part 106 of the adhesive layer 105A protrudes through the opening 101c by forming the opening 101c on the first substrate 101 and the semiconductor chip 107 is pressed to the protruding part 106 of the adhesive layer, and thereafter, the hardening process. Therefore, since only one bonding process is performed, the number of processes is reduced to simplify the process.

Further, since the manufacturing of the package is completed by one bonding process, the cost of materials is also reduced, and as a result, a process cost may also be reduced.

By forming the concave 101a on the first substrate 101 mounted with the semiconductor chip 107, a gap between the semiconductor chip 107 and the second substrate 103 is reduced, and as a result, a heat dissipating path is shortened, thereby improving a heat dissipating property.

In general, when the bonding section 105 is formed by performing the hardening process, the semiconductor chip 107 may be warped from an original position for self-alignment or rotation. In the preferred embodiment, the semiconductor chip 107 is suspended on the side of the concave 101a to prevent the semiconductor chip 107 from moving or rotating so as to deviate from a predetermined range.

Semiconductor Package Module

Figure 5:
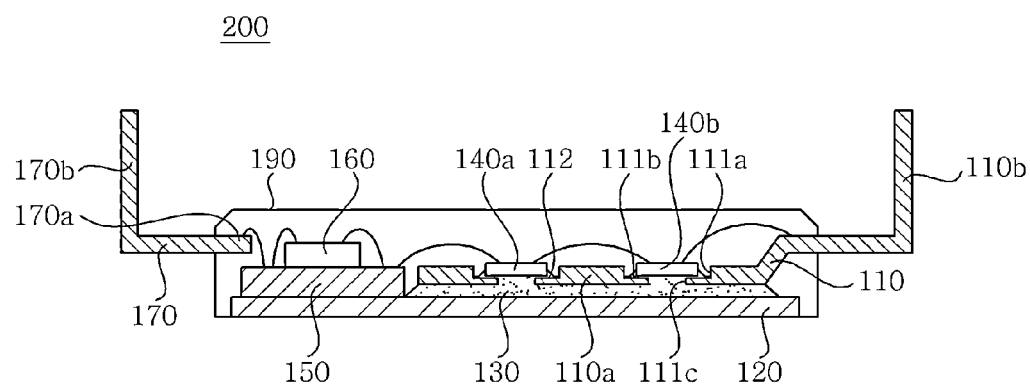
FIG. 5 is a cross-sectional view illustrating the structure of a semiconductor package module according to a preferred embodiment of the present invention.
Figure 6:
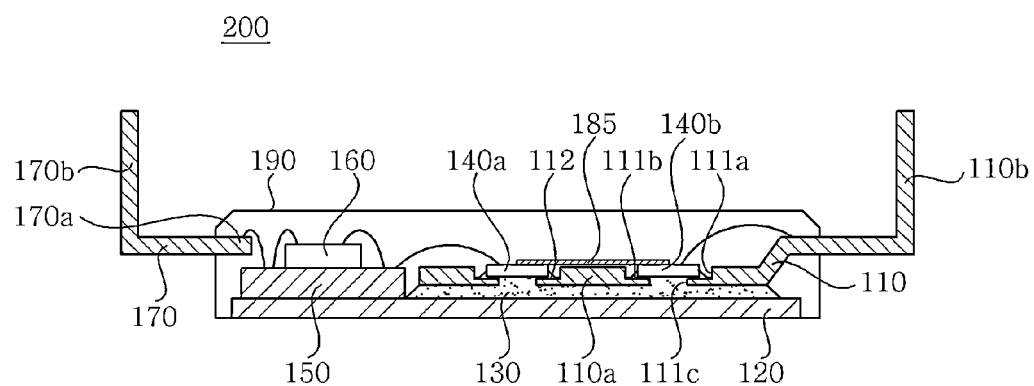
FIG. 6 is a cross-sectional view illustrating the structure of a semiconductor package module according to another preferred embodiment of the present invention.
Figure 7:
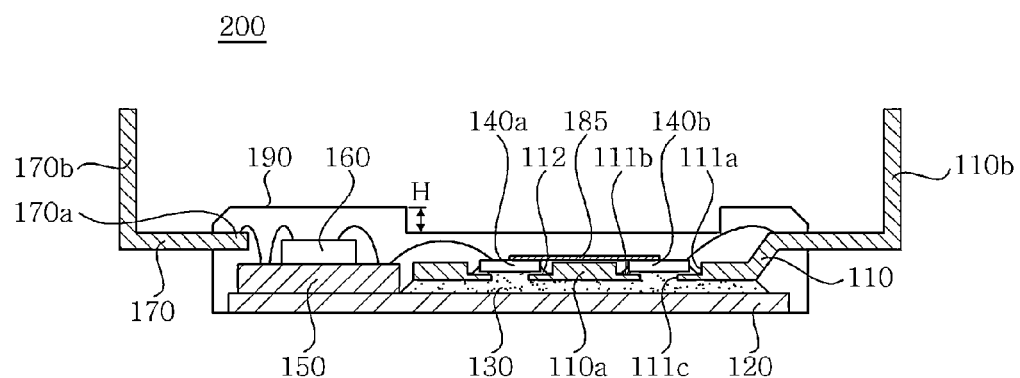
FIG. 7 is a cross-sectional view illustrating the structure of a semiconductor package module according to yet another preferred embodiment of the present invention.

FIG. 5 is a cross-sectional view illustrating the structure of a semiconductor package module according to a preferred embodiment of the present invention, FIG. 6 is a cross-sectional view illustrating the structure of a semiconductor package module according to another preferred embodiment of the present invention, and FIG. 7 is a cross-sectional view illustrating the structure of a semiconductor package module according to yet another preferred embodiment of the present invention.

First, referring to FIG. 5, a semiconductor package module 200 according to the preferred embodiment of the present invention includes a first substrate 110, a second substrate 120, and first semiconductor chips 140a and 140b.

In the preferred embodiment, in the first substrate 110, one or more concaves 110a may be formed on one surface of one side 110a and an opening 101c may be formed on a bottom surface 101b of each of the concaves 110a as shown in FIG. 5.

Herein, the first substrate 110 may be a lead frame made of copper (Cu) and one side 110a contacts the second substrate 120 and the other side 110b may protrude from the second substrate 120 as shown in FIG. 5. The other side 110b of the first substrate 110 that protrudes may serve as an external connection terminal.

In the preferred embodiment, the second substrate 120 contacts the other surface of one side 110a of the first substrate 110 and may further include a bonding section 130 interposed between the other surface of one side 110a of the first substrate 110 and one surface of one side of the second substrate 120.

Herein, a part 112 of the bonding section 130 is inserted into the concave 110a through the opening 110c of the first substrate 110 to contact the first semiconductor chips 140a and 140b.

The bonding section 130 may be made of solder, a non-conductive epoxy based resin, a conductive resin, or a conductive film, but is not particularly limited thereto.

Herein, the first semiconductor chips 140a and 140b may include a silicon controlled rectifier (SCR), a power transistor, an insulated gate bipolar transistor (IGBT), a MOS transistor, a power rectifier, a power regulator, an inverter, a converter, or a high-power semiconductor chip or diode, constituted by combinations thereof, but is not particularly limited thereto.

In the preferred embodiment, the first semiconductor chips 140a and 140b inserted into the concave 110a of the first substrate 110 may be semiconductor chips of the same type or semiconductor chips of different types.

That is, both the semiconductor chips of the same type may be inserted in the plurality of concaves 110a formed on the first substrate 110 or different types of semiconductor chips may be inserted into the concaves 110a.

The semiconductor package module 200 according to the preferred embodiment may further include a third substrate 150 contacting the other side of one surface of the second substrate 120 and a semiconductor chip 160 mounted on the third substrate 150.

Herein, the third substrate 150 may be a printed circuit board (PCB), but is not particularly limited thereto.

Further, the second semiconductor chip 160 may be attached onto the third substrate 150 by using an adhesive member (not shown) and the adhesive member (not shown) may be conductive or non-conductive.

For example, the adhesive member may be formed by plating or may be conductive paste or a conductive tape. Further, the adhesive member may be solder, metallic epoxy, metallic paste, a resin based epoxy, or an adhesive tape having excellent heat resistivity.

For example, the adhesive tape that may be used as the adhesive member may include a high-temperature tape such as a known commercialized glass tape, silicon tape, Teflon tape, stainless foil tape, or ceramic tape and further, the adhesive member may be formed by combining the materials, but is not particularly limited thereto.

In the preferred embodiment, the second semiconductor chip 160 may include a low-power semiconductor chip for controlling the high-power semiconductor chip, e.g., a control element for controlling a power element, but is not particularly limited thereto.

Further, the semiconductor package module 200 according to the preferred embodiment further includes a lead frame 170 electrically connected with the third substrate 150.

Herein, the lead frame 170 may be made of copper (Cu), but is not particularly limited thereto. In this case, one side 170a of the lead frame 170 may be electrically connected with the third substrate 150 by using a wire and the other side 170b protrudes to the outside to serve as an external connection terminal.

Further, the semiconductor package module 200 according to the preferred embodiment may further include a connection member 185 electrically connecting each of the first semiconductor chips 140a and 140b in each concave 110a of the first substrate 110 as shown in FIG. 6.

Herein, the connection member 185 may be made of copper (Cu) and as shown in FIG. 6, the connection member 185 may be a tape type, a frame type, or a ribbon type, but is not particularly limited thereto.

By this configuration, by connecting the semiconductor chips to each other by using the linear connection member 185 instead of the arch-type wire, parts H of a molding material 190 at positions corresponding to portions where the first semiconductor chips 140a and 140b are mounted may be removed in a thickness direction.

As a result, a delivery path is shortened because the thickness of the molding material 190 formed on the top surface of the first semiconductor chips 140a and 140b is small. Therefore, a heat dissipating property can be improved.

Further, since a spare space equivalent to the removed thickness of the molding material 190 can be secured, the degree of freedom of design is improved.

As set forth above, according to preferred embodiments of the present invention, a plurality of substrates and semiconductor chips are bonded to each other through one bonding process, and a result, process efficiency is improved due to process simplification and a manufacturing cost is reduced.

Further, concaves are formed on a first substrate mounted with the semiconductor chips and the semiconductor chips are inserted and mounted into the concaves, and as a result a heat dissipating path between the semiconductor chip and the second substrate is shortened, thereby improving a heat dissipating property.

The semiconductor chips are inserted and mounted into the concaves formed on the substrate and the mounted semiconductor chips are connected to each other by using a tape-type connection member. Thereafter, by removing molding materials on the tops of the semiconductor chips in a thickness direction, the total height of a module decreases to miniaturize the module.

By bonding all components of a semiconductor package through one bonding process, bonding power increases and thermal damage of a semiconductor due to repetition of the bonding process decreases, thereby improving reliability of a product after bonding.

By forming an opening on the semiconductor chip mounted substrate, warpage phenomenon which may occur at the time of manufacturing the product can be prevented.

Although the preferred embodiments of the present invention have been disclosed for illustrative purposes, the semiconductor package and the method for manufacturing the same and the semiconductor package module having the same according to the present invention are not limited thereto and those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention. A specific protective scope of the present invention could be defined by accompanying claims.

What is claimed is:

1. A semiconductor package comprising:
a first substrate having top and bottom surfaces, a concave formed on the top surface thereof and an opening formed on a bottom surface of the concave;
a second substrate having top and bottom surfaces, the bottom surface of the first substrate disposed on the top surface of the second substrate;
a semiconductor chip having top and bottom surfaces, the bottom surface of the semiconductor chip mounted in the concave; and
a bonding section interposed between the first substrate and the second substrate, the bonding section being made of solder.

2. The semiconductor package as set forth in claim 1, wherein the bonding section contacts the entire bottom surface of the semiconductor chip mounted in the concave through the opening of the first substrate.

3. The semiconductor package as set forth in claim 1, wherein the first substrate and the second substrate are a metallic substrate, a ceramic substrate, or an epoxy based resin substrate.

4. A semiconductor package module, comprising:
a first substrate having top and bottom surfaces, one or more concaves formed on the top surface thereof and an opening formed on a bottom surface of the concave;
a second substrate having top and bottom surfaces, the bottom surface of the first substrate disposed on the top surface of the second substrate;
a first semiconductor chip having top and bottom surfaces, the bottom surface of the first semiconductor chip mounted in the concave; and a bonding section interposed between the first substrate and the second substrate, the bonding section being made of solder, wherein one side of the first substrate protrudes from the second substrate to serve as an external connection terminal.

5. The semiconductor package module as set forth in claim 4, wherein the bonding section contacts the entire bottom surface of the first semiconductor chip mounted in the concave through the opening of the first substrate.

6. The semiconductor package module as set forth in claim 4, wherein the first substrate is a lead frame made of copper (Cu).

7. The semiconductor package module as set forth in claim 4, further comprising:
a third substrate disposed on the top surface of the second substrate; and
a second semiconductor chip mounted on the third substrate.

8. The semiconductor package module as set forth in claim 7, further comprising the lead frame electrically connected with the third substrate.

9. The semiconductor package module as set forth in claim 7, wherein the third substrate is a printed circuit board (PCB).

10. The semiconductor package module as set forth in claim 4, further comprising one or more first semiconductor chips and a connection member area contacting the top surfaces of the first semiconductor chips and electrically connecting the first semiconductor chips mounted in the one or more concaves to each other.

11. The semiconductor package module as set forth in claim 10, wherein the connection member is a tape type, a frame type, or a ribbon type.

12. The semiconductor package module as set forth in claim 4, further comprising a molding material formed to cover the top surface of the first semiconductor chip from a side surface of the second substrate.

13. The semiconductor package module as set forth in claim 12, wherein a part of an area of the molding material corresponding to the first semiconductor chip is removed in a thickness direction from the surface thereof.

14. A semiconductor package module, comprising:
a first substrate having a top surface and a bottom surface, one or more concaves formed on the top surface thereof and an opening formed on a bottom surface of the concave;
a second substrate having a top surface and a bottom surface, the bottom surface of the first substrate disposed on the top surface of the second substrate;
a third substrate having a top surface and a bottom surface, the bottom surface of the third substrate disposed on the top surface of the second substrate; and
a first semiconductor chip having a top surface and a bottom surface, the bottom surface of the first semiconductor chip mounted in the concave,
wherein one side of the first substrate protrudes from the second substrate to serve as an external connection terminal.

15. The semiconductor package module as set forth in claim 14, further comprising a second semiconductor chip mounted on the third substrate.

16. The semiconductor package module as set forth in claim 14, further comprising the lead frame electrically connected with the third substrate.

17. The semiconductor package module as set forth in claim 14, wherein the third substrate is a printed circuit board (PCB).

18. A semiconductor package module, comprising:
a first substrate having a top surface and a bottom surface, one or more concaves formed on the top surface thereof and an opening formed on a bottom surface of the concave;
a second substrate having a top surface and a bottom surface, the bottom surface of the first substrate disposed on the top surface of the second substrate;
one or more first semiconductor chips having a top surface and a bottom surface, respectively, the bottom surfaces of the first semiconductor chips mounted in the concave; and
a connection member area contacting the top surfaces of the first semiconductor chips and electrically connecting the first semiconductor chips mounted in the one or more concaves to each other;
wherein one side of the first substrate protrudes from the second substrate to serve as an external connection terminal.

19. The semiconductor package module as set forth in claim 18, wherein the connection member is a tape type, a frame type, or a ribbon type.

20. A semiconductor package module, comprising:
a first substrate having a top surface and a bottom surface, one or more concaves formed on the top surface thereof and an opening formed on a bottom surface of the concave;
a second substrate having a top surface and a bottom surface, the bottom surface of the first substrate disposed on the top surface of the second substrate;
a first semiconductor chip having a top surface and a bottom surface, the bottom surface of the first semiconductor chip mounted in the concave; and
a molding material formed to cover the top surfaces of the first semiconductor chip and a third substrate from a side surface of the second substrate;
wherein a part of an area of the molding material corresponding to the first semiconductor chip is removed in a thickness direction from the surface thereof, and
wherein one side of the first substrate protrudes from the second substrate to serve as an external connection terminal.

* * * * *